United States Patent [19]
Zama et al.

[11] Patent Number: 5,583,829
[45] Date of Patent: Dec. 10, 1996

[54] PIEZOELECTRIC VIBRATOR WITH AN IMPROVED SUPPORTING STRUCTURE

[75] Inventors: Koichi Zama; Takeshi Inoue, both of Tokyo, Japan

[73] Assignee: NEC Corporation, Tokyo, Japan

[21] Appl. No.: 504,804

[22] Filed: Jul. 19, 1995

[30] Foreign Application Priority Data

Jul. 19, 1994 [JP] Japan .................................. 6-166857

[51] Int. Cl.$^6$ .................................................. H04R 11/00
[52] U.S. Cl. ............................................................ 367/188
[58] Field of Search ................................... 367/165, 174, 367/177, 188, 140, 137; 381/159, 205; 310/334, 335, 336, 337

[56] References Cited

U.S. PATENT DOCUMENTS

| | | |
|---|---|---|
| 2,247,627 | 7/1941 | Atwood et al. . |
| 2,284,088 | 5/1942 | Gerber . |
| 3,721,841 | 3/1973 | Wilson . |
| 4,109,757 | 8/1978 | Hebberd ................................. 367/165 |

FOREIGN PATENT DOCUMENTS

| | | |
|---|---|---|
| 57-138211 | 8/1982 | Japan . |
| 63-185528 | 11/1988 | Japan . |
| 2-5922 | 1/1990 | Japan . |
| 2225160 | 5/1990 | United Kingdom . |

Primary Examiner—Daniel T. Pihulic
Attorney, Agent, or Firm—Young & Thompson

[57] ABSTRACT

A piezoelectric vibrator comprises a piezoelectric element having a rectangular shape and being provided with at least one input electrode from which an input lead extends and at least one output electrode from which an output lead extends; and a case having a rectangle-like shape for accommodating the piezoelectric element and having at least through holes through which the input and output leads penetrate thereby the leads project to an exterior of the case. The through holes have a size larger than a size of the leads to create a clearance between the leads and inner walls of the through holes so as to allow the leads to show a displacement or a vibration due to the vibration of the piezoelectric element. The case has a size larger than a size of the piezoelectric element for forming gaps between the piezoelectric element and the case to allow the piezoelectric element to be freely vibrate, the piezoelectric element being merely placed on a bottom of the case but not fixed nor adhered thereon to allow the piezoelectric element to be freely vibrated.

24 Claims, 6 Drawing Sheets 5,583,829

PIEZOELECTRIC VIBRATOR WITH AN IMPROVED SUPPORTING STRUCTURE

BACKGROUND OF THE INVENTION

1. Field of the Invention

The invention relates to a piezoelectric vibrator, and more particularly to an improvement in supporting structure of a piezoelectric vibrator having a plate-like piezoelectric element.

2. Description of the Prior Art

The value and importance of improvements for supporting structures of the piezoelectric vibrator having a plate like piezoelectric element are considerable to realize a scaling down of the piezoelectric vibrator and to render the piezoelectric vibrator a light weight as well as to ensure a high reliability of the piezoelectric vibrator.

One of conventional piezoelectric vibrators is disclosed in the Japanese Laid-open Patent Application No. 57-138211 and a structure for supporting the same will be described with reference to FIG. 1.

A plate-like piezoelectric element 21 is accommodated within a cover 23 to be spaced through a gap from an inner surface of the cover 23. Leads 22 are provided to protect from an interior of the cover 23 in an exterior thereof. In the cover 23, the leads 22 are provided at the opposite sides of the plate-like piezoelectric element 21 to be mechanically connected through connecting arms to the plate-like piezoelectric element 21. Namely, the plate-like piezoelectric element 21 is supported through the connecting arms and the leads 22 which are fitted within through holes through which the leads penetrates from the interior of the cover 23 to the exterior thereof.

This conventional supporting structure has a disadvantage in insufficient supporting capability due to the fact that the plate-like piezoelectric element 21 is supported through the connecting arms by the leads 22 which are fixed to the cover 23 but only at the through holes through which the leads 22 are penetrates through the covers 23. Such structure is insufficient for ensuring a high reliability even when the piezoelectric vibrator receives a strong shock. Namely, such structure provides the piezoelectric vibrator with an insufficient shock resistance, resulting in that a mechanical quality factor Qm is lowered.

Another of the conventional supporting structure of the piezoelectric vibrators is disclosed in the Japanese Laid-open Utility Model Application No. 2-5922, which will be described with reference to FIG. 2.

The piezoelectric vibrator comprises a piezoelectric porcelain resonator. A cover 23 made of a silicone rubber accommodates a piezoelectric vibrator 21 and a piezoelectric porcelain vibration plate 24, both of which are securely fined one another and applied with a liquid state insulator such as silicone oil. The united piezoelectric vibrator 21 and the piezoelectric porcelain vibration plate 24 are connected through solder or conductive adhesive 25 to leads 22 which penetrate through through holes of the cover 23 from an interior thereof to an exterior thereof. The leads 22 are fitted within the through holes of the cover 23 and supported only through the fitting faces with the through holes thereof.

Such structure also has a disadvantage in insufficient supporting capability due to the fact that the piezoelectric vibrator 21 and the piezoelectric porcelain vibration plate 24 are are supported through the leads 22 which are fixed to the cover 23 but only at the through holes through which the leads 22 are penetrates through the covers 23. Such structure is insufficient for ensuring a high reliability even when the piezoelectric vibrator receives a strong shock. Namely, such structure provides the piezoelectric vibrator with an insufficient shock resistance, resulting in that a mechanical quality factor Qm is lowered.

Still another of the conventional piezoelectric vibrators is disclosed in the Japanese Laid-open Utility Model Application No. 63-185528, which will be described with reference to FIG. 3. A piezoelectric vibrator 1 is supported by a plurality of projections 27 provided on an inner surface of an armor case 26. Such structure may provide a sufficient capability of supporting the piezoelectric vibrator, however, the piezoelectric may provide a difficulty in vibration of the piezoelectric vibrator 1, resulting in a deterioration of the performance of the vibrator.

It would, therefore, be required to develop a quite novel supporting structure for supporting a piezoelectric vibrator with or without a piezoelectric porcelain resonance having a highly mechanical quality factor and an excellent vibration performance.

SUMMARY OF THE INVENTION

Accordingly, it is an object of the present invention to provide a novel supporting structure for supporting a piezoelectric vibrator free from any disadvantages as described above.

It is a further object of the present invention to provide a novel supporting structure for supporting a piezoelectric vibrator for allowing the piezoelectric vibrator to exhibit excellent vibration properties.

It is a furthermore object of the present invention to provide a novel supporting structure for supporting a piezoelectric vibrator for allowing the piezoelectric vibrator to have a highly mechanical quality factor.

It is a still further object of the present invention to provide a novel supporting structure for supporting a piezoelectric vibrator for allowing the piezoelectric vibrator to have an excellent sock-resistance.

It is yet a further object of the present invention to provide a novel supporting structure for supporting a piezoelectric vibrator for allowing the piezoelectric vibrator to ensure a highly reliability under variety of conditions.

It is moreover object of the present invention to provide a novel supporting structure for supporting a piezoelectric vibrator for allowing the piezoelectric vibrator to have an improved electrodynamic coupling coefficient.

It is still more object of the present invention to provide a novel supporting structure for supporting a piezoelectric vibrator for allowing the piezoelectric vibrator to be free from issues of heat generation and vibration loss due to a friction between the piezoelectric vibrator and a case accommodating the same.

It is another object of the present invention to provide a novel supporting structure for supporting a piezoelectric vibrator for allowing the piezoelectric vibrator to have a simple structure.

It is still another object of the present invention to provide a novel supporting structure for supporting a piezoelectric vibrator for allowing the piezoelectric vibrator to be scaled down.

It is yet another object of the present invention to provide a novel supporting structure for supporting a piezoelectric vibrator for allowing the piezoelectric vibrator to free from any requirement of an alignment at a high accuracy when accommodating the piezoelectric vibrator in a case.

The above and other objects, features and advantages of the present invention will be apparent from the following descriptions.

The invention provides a piezoelectric vibrator comprising a piezoelectric element showing a vibration by receiving an alternating voltage and having a rectangular shape and further being provided with at least one input electrode from which an input lead extends and at least one output electrode from which an output lead extends ; and a case having a rectangle-like shape for accommodating the piezoelectric element and having at least through holes through which the input and output leads penetrate thereby the leads project to an exterior of the case. The through holes have a size larger than a size of the leads to create a clearance between the leads and inner walls of the through holes so as to allow the leads to show a displacement or a vibration due to the vibration of the piezoelectric element. The case has a size larger than a size of the piezoelectric element for forming gaps between the piezoelectric element and the case to allow the piezoelectric element to be freely vibrate. The piezoelectric element is merely placed on a bottom of the case but not fixed nor adhered thereon to allow the piezoelectric element to be freely vibrated.

The leads are provided at positions corresponding to nodes in the vibrations of the piezoelectric element to keep the leads in showing almost no vibration. Further, a plurality of projections may be formed at least on an inner surface of the bottom of the case so that the piezoelectric element is supported through the projections. Furthermore, a plurality of coating layers coat individuals of the projections wherein the coating layers have a smaller friction coefficient than a friction coefficient of the projections. The coating layers are made of "TEFLON" synthetic resin polymer or "DELRIN" homopolymer acetal resin. The projections are provided in the vicinity of the nodes of the piezoelectric element. Still further a plurality of recesses are may be formed at least on an inner surface of the bottom of the case and a plurality of balls are provided to be received in the recesses so that the piezoelectric element is supported through the balls. The recesses receiving the balls are provided in the vicinity of the nodes of the piezoelectric element. Moreover, a coating film may be formed at least on an inner surface of the bottom of the case so that the piezoelectric element is supported through the coating film on the bottom of the case wherein the coating film have a smaller friction coefficient than a friction coefficient of the case. The coating layers may be made of Teflon or Delrine. 14. The case may be made of a polycarbonate resin, a glass epoxy resin, a phenol resin, a polyester resin, a melamine resin and an an epoxy resin.

BRIEF DESCRIPTIONS OF THE DRAWINGS

Preferred embodiments of the present invention will hereinafter be described in detail with reference to the accompanying drawings.

DESCRIPTION OF THE PREFERRED EMBODIMENTS

Figure 1:
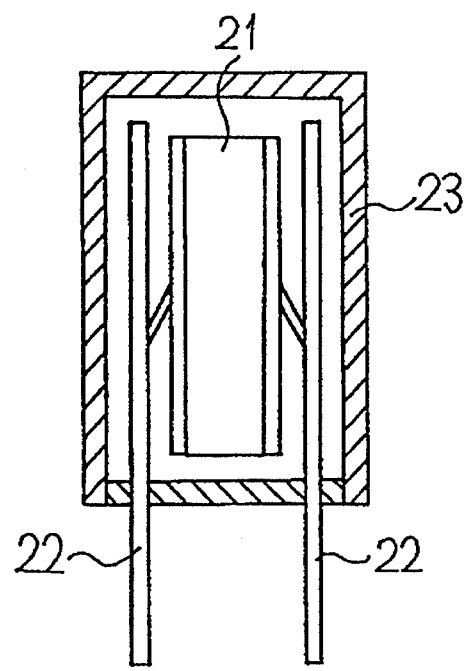
FIG. 1 is a cross sectional elevation view illustrative of the conventional supporting structure for supporting the piezoelectric vibrator.
Figure 2:
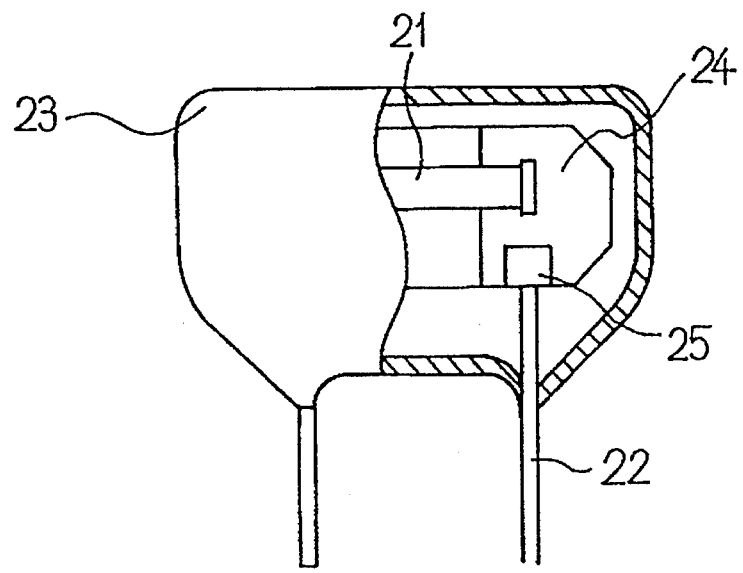
FIG. 2 is a cross sectional elevation view illustrative of the other conventional supporting structure for supporting the piezoelectric vibrator.
Figure 3:
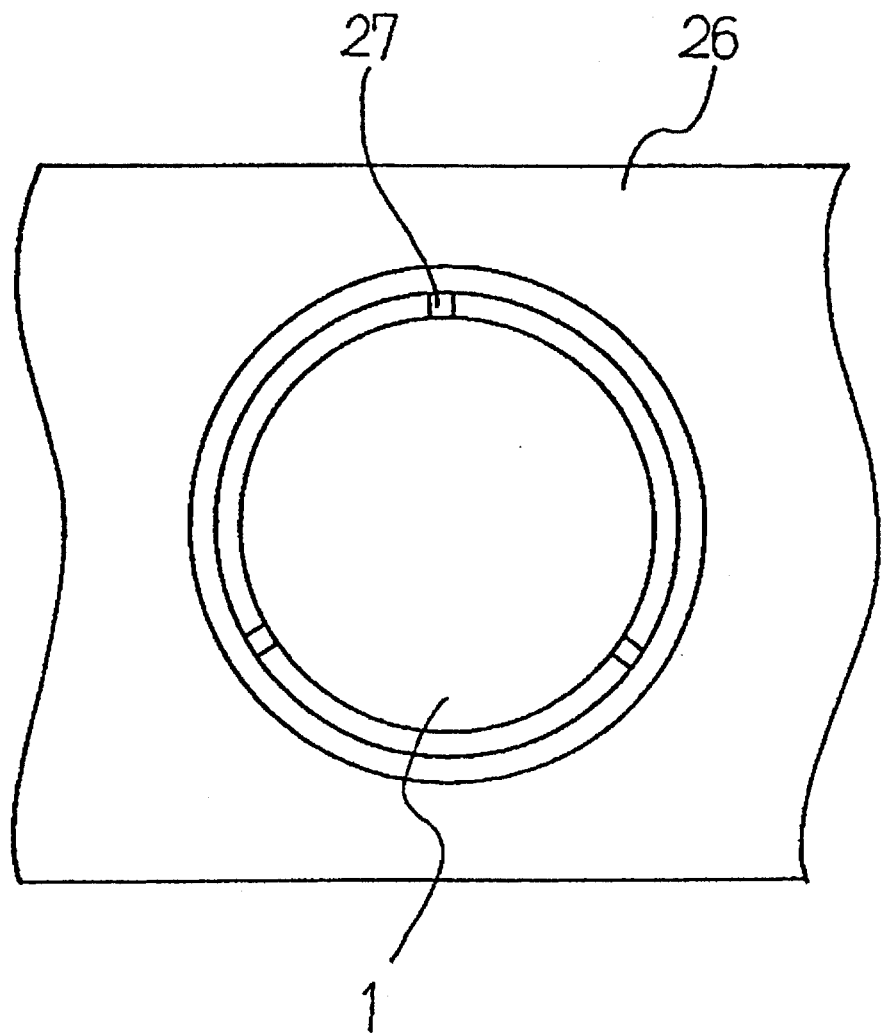
FIG. 3 is a cross sectional elevation view illustrative of the still other conventional supporting structure for supporting the piezoelectric vibrator.
Figure 4:
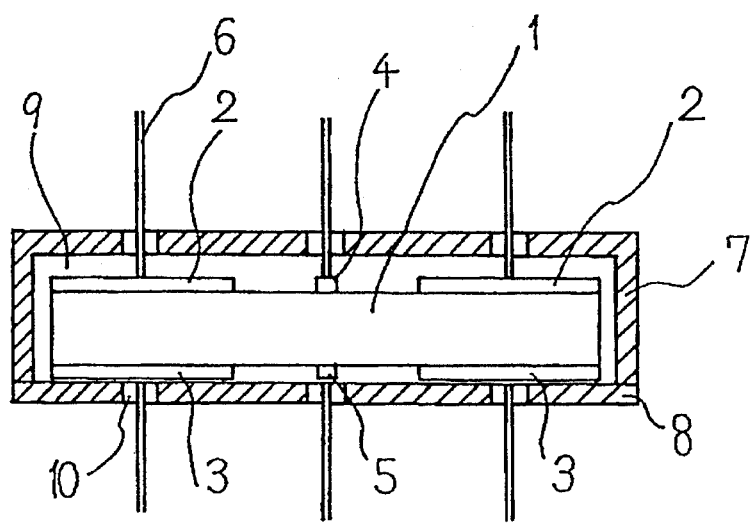
FIG. 4 is a cross sectional elevation view illustrative of a novel supporting structure for supporting a piezoelectric vibrator in a first embodiment according to the present invention.

A first embodiment according to the present invention will be described with reference to FIG. 4 in which a novel supporting structure for supporting a piezoelectric vibrator having a plate-like shape is provided.

A piezoelectric vibrator in a first embodiment according to the present invention comprises a piezoelectric transducer 1 accommodated in a case 7 comprising a bottom plate 8 on which the piezoelectric transducer 1 is placed and a cover provided on the bottom plate 8. The piezoelectric transducer has a plate-like shape, for example, 37×6×1 millimeters-size. The piezoelectric transducer 1 is made of a piezoelectric porcelain. The piezoelectric transducer 1 is provided with top and bottom input and output electrodes 2 and 3 thereon. The top input electrodes 2 are provided on a top surface of the piezoelectric transducer 1 at opposite end regions thereof as well as the bottom electrodes 3 are provided on a top surface of the piezoelectric transducer 1 at opposite end regions thereof. The top and bottom output electrodes 4 and 5 are provided on the top and bottom surfaces of the piezoelectric transducer 1 at a center position thereof. Each of the top input electrodes 2 has a lead 6 extending upward from a center portion thereof and penetrating through a through hole 10 formed in the cover constituting, together with the bottom plate 8, the case 7. Each of the bottom input electrodes 3 has a lead 6 extending downward from a center portion thereof and penetrating through a through hole 10 formed in the bottom plate 8 constituting, together with the cover, the case 7. The top output electrode 4 has a lead 6 extending upward from a center portion thereof and penetrating through a through hole 10 formed in the cover constituting, together with the bottom plate 8, the case 7. The bottom output electrode 5 has a lead 6 extending downward from a center portion thereof and penetrating through a through hole 10 formed in the bottom plate 8 constituting, together with the cover, the case 7. The piezoelectric transducer 1 is designed to show a vibration with nodes being positioned corresponding to the positions at which the leads 6 are provided. Each of the leads is soldered at node point of each of the electrodes. The leads 6 comprise copper wires coated with tin and have a diameter of 0.1 millimeters so that the leads 6 have a sufficient flexibility for allowing the vibration of the piezoelectric transducer 1 and a capability for allowing a high power to be applied to the piezoelectric transducer 1. The above case 7 may be made of a polycarbonate resin.

The followings are important for the present invention. Each of the through holes 10 through which the leads 6 penetrate has a larger diameter or size than a diameter or a size of the leads 6 so that each of the leads 6 is spaced apart from an inner wall of each of the through holes 10 so that there is provided a clearance between the lead 6 and the inner wall of the through hole formed in the case 7 thereby the leads 6 are allowed to show a small displacement or a vibration. The case 7 is so designed that there are gaps in the horizontal and vertical directions between the piezoelectric transducer 1 and the inner wall of the case 7. That is, the case 7 is so designed as to have slightly larger height, wide and length than those of the piezoelectric transducer 1. The piezoelectric transducer 1 is merely put on the bottom plate 8 constituting the case 7, however, not fixed nor adhered to the bottom plate 8 or the case 7 so that the piezoelectric transducer 1 united with the leads 6 is permitted to show a vibration and a displacement defined in the horizontal direction by the clearance associated with the through holes or the clearance between the leads 6 and the inner wall of the through holes 10 and defined in a gap between a top of the top electrode on the piezoelectric transducer 1 and a top of the inner walls of the case 7. For example, the case 7 may be so designed that the gap 9 be 0.3 millimeters in the vertical, horizontal and longitudinal directions respectively. The through holes 10 may be designed to have a diameter of 3 millimeters.

Performances and properties of the piezoelectric vibrator were measured by use of an impedance analyzer. The measured electrodynamic coupling coefficient Qm of the piezoelectric transducer 1 showing a vibration with a small amplitude was the same as that before the piezoelectric transducer was supported. To evaluate performances of the piezoelectric transducer 1 showing a vibration with a large amplitude, the piezoelectric transducer 1 is applied with an alternating voltage with sine wave of a frequency about 130 kHz. A cold cathode having a diameter of 3.0 millimeters and a length of 220 millimeters is loaded for burning test thereof thereby it was confirmed that input and output voltages, currents and powers are the same as those before the piezoelectric transducer 1 is supported. There was also confirmed the facts that a degree of brightness of the cold cathode and a heat temperature of the piezoelectric transducer 1 are the same as those before the piezoelectric transducer 1 is supported. A hundred of the piezoelectric vibrators were subjected to vibration and impact tests under an lacceleration of 100 G for subsequent remeasurments of the performances and properties thereof. That is, the piezoelectric vibrator subjected to the vibration and the impact is subjected again to the small vibration test using the impedance analyzer for the purpose of measuring the performance when the small vibration is shown as well as again to the burning test by having the cold cathode loaded for the purpose of measuring the properties of the piezoelectric transducer showing the large vibration. The performances of the piezoelectric transducer 1 showing either the small or large vibration are not changed.

The above measuring results would prove that the improved supporting structure of the piezoelectric vibrator for supporting the piezoelectric transducer 1 permits the piezoelectric transducer to exhibit the same performances as those shown by the piezoelectric transducer not supported. That is, the supporting structure for supporting the piezoelectric transducer 1 permits the piezoelectric vibrator to exhibit excellent vibration properties inherently possessed free of support. The supporting structure also permits the piezoelectric vibrator to have the same highly mechanical quality factor as that when the piezoelectric transducer is not supported. Notwithstanding, the supporting structure permits the piezoelectric vibrator to show an excellent impact-resistance thereby a highly reliability of the piezoelectric vibrator is kept under variety of conditions. The supporting supporting structure also permits the piezoelectric transducer to have a high electrodynamic coupling coefficient. The supporting structure also permits the piezoelectric transducer to be free from the issues both of heat generation and of vibration loss on the ground that since the piezoelectric transducer 1 is not fixed nor adhered to the case 7, a reduced friction is caused between the piezoelectric transducer 1 and the case 7. The supporting structure is quite simple, for that reason a scale down of the vibrator is permitted and further a production of the vibrator with a reduced cost is also permitted. The supporting structure is free of the requirement of an alignment at a high accuracy when the piezoelectric transducer 1 is supported and accommodated in the case 7.

Whereas in the above embodiment the case 7 is made of polycarbonate, the case 7 may alternatively be made of a glass epoxy resin. The piezoelectric transducer 1 accommodated in the glass epoxy resin case was subjected to the foregoing measuring teats thereby it was confirmed that the supporting structure may permit the piezoelectric transducer 1 to exhibit the same excellent performances and properties as when the polycarbonate case 7 is used. Other available material for the case 7 may be a phenol resin, a polyester resin, melanin resin and an epoxy resin individuals of which provide the same effect as the polycarbonate resin.

Although the gap 9 between the piezoelectric transducer 1 and the inner wall of the case 7 is set 0.3 millimeters, a gap in the range from 0.1 to 0.5 millimeters is available as providing the same effect as the 0.3 millimeters gap. The diameter of the through hole 10 may be not less than 2 millimeters to prevent the case 7 to hit with the solder for bonding the leads to the piezoelectric transducer 1.

Figure 5:
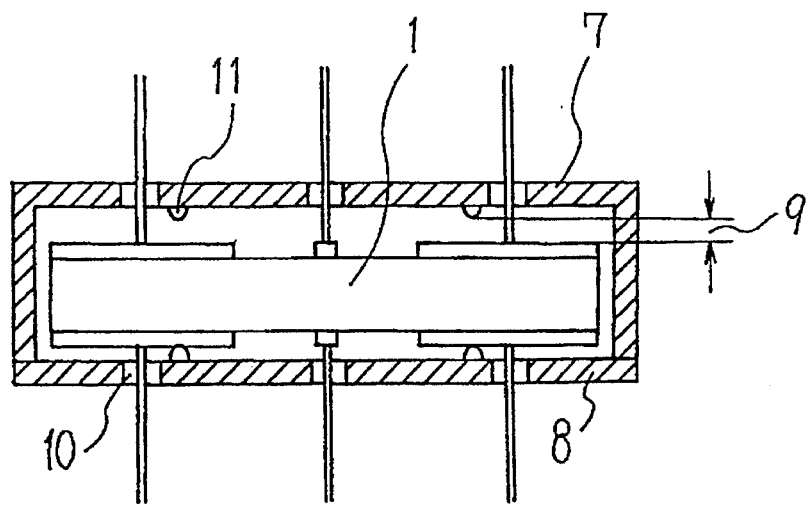
FIG. 5 is a cross sectional elevation view illustrative of a novel supporting structure for supporting a piezoelectric vibrator in a second embodiment according to the present invention.

A second embodiment according to the present invention will be described in which a novel supporting structure for supporting a piezoelectric vibrator having a plate-like shape is provided. A piezoelectric vibrator of the second embodiment has a structural difference from that of the first embodiment in view of further providing a plurality of projections 11 which hit with input electrode formed on a piezoelectric transducer. The detailed description will be made with reference to FIG. 5.

A piezoelectric vibrator in a second embodiment according to the present invention comprises a piezoelectric transducer 1 accommodated in a case 7 comprising a bottom plate 8 on which the piezoelectric transducer 1 is placed and a cover provided on the bottom plate 8. The piezoelectric transducer has a plate-like shape, for example, 37×6×1 millimeters-size. The piezoelectric transducer 1 is made of a piezoelectric porcelain. The piezoelectric transducer 1 is provided with top and bottom input and output electrodes 2 and 3 thereon. The top input electrodes 2 are provided on a top surface of the piezoelectric transducer 1 at opposite end regions thereof as well as the bottom electrodes 3 are provided on a top surface of the piezoelectric transducer 1 at opposite end regions thereof. The top and bottom output electrodes 4 and 5 are provided on the top and bottom surfaces of the piezoelectric transducer 1 at a center position thereof. Each of the top input electrodes 2 has a lead 6 extending upward from a center portion thereof and penetrating through a through hole 10 formed in the cover constituting, together with the bottom plate 8, the case 7. Each of the bottom input electrodes 3 has a lead 6 extending downward from a center portion thereof and penetrating through a through hole 10 formed in the bottom plate 8 constituting, together with the cover, the case 7. The top output electrode 4 has a lead 6 extending upward from a center portion thereof and penetrating through a through hole 10 formed in the cover constituting, together with the bottom plate 8, the case 7. The bottom output electrode 5 has a lead 6 extending downward from a center portion thereof and penetrating through a through hole 10 formed in the bottom plate 8 constituting, together with the cover, the case 7. The piezoelectric transducer 1 is designed to show a vibration with nodes being positioned corresponding to the positions at which the leads 6 are provided. Each of the leads is soldered at node point of each of the electrodes. The leads 6 comprise copper wires coated with tin and have a diameter of 0.1 millimeters so that the leads 6 have a sufficient flexibility for allowing the vibration of the piezoelectric transducer 1 and a capability for allowing a high power to be applied to the piezoelectric transducer 1. The above case 7 may be made of a polycarbonate resin.

The followings are important for the present invention. A plurality of projections 11 are formed on top and bottom inner walls of the case 7 so that the projections formed on the bottom inner wall or on the bottom plate 8 are made contact with the bottom input electrodes 3 thereby the piezoelectric transducer 1 is substantially supported by the projections 11. Each of the projections has a height of 0.1 millimeters and a diameter of 1 millimeter. As compared to the supporting structure of the first embodiment, the projections 11 of the second embodiment may reduce an area contacting with the bottom electrodes 3 thereby a friction between the piezoelectric transducer 1 and the case 7 is considerably reduced.

Each of the through holes 10 through which the leads 6 penetrate has a larger diameter or size than a diameter or a size of the leads 6 so that each of the leads 6 is spaced apart from an inner wall of each of the through holes 10 so that there is provided a clearance between the lead 6 and the inner wall of the through hole formed in the case 7 thereby the leads 6 are allowed to show a small displacement or a vibration. The case 7 is so designed that there are gaps in the horizontal and vertical directions between the piezoelectric transducer 1 and the inner wall of the case 7. That is, the case 7 is so designed as to have slightly larger height, wide and length than those of the piezoelectric transducer 1. The piezoelectric transducer 1 is merely put on the bottom plate 8 constituting the case 7, however, not fixed nor adhered to the bottom plate 8 or the case 7 so that the piezoelectric transducer 1 united with the leads 6 is permitted to show a vibration and a displacement defined in the horizontal direction by the clearance associated with the through holes or the clearance between the leads 6 and the inner wall of the through holes 10 and defined in a gap between a top of the top electrode on the piezoelectric transducer 1 and a top of the inner walls of the case 7. For example, the case 7 may be so designed that a gap 9 be 0.3 millimeters between a top of the top projections 11 and a top of the top output electrodes 2. The through holes 10 may be designed to have a diameter of 3 millimeters.

Performances and properties of the piezoelectric vibrator were measured by use of an impedance analyzer. The measured electrodynamic coupling coefficient Qm of the piezoelectric transducer 1 showing a vibration with a small amplitude was the same as that before the piezoelectric transducer was supported. To evaluate performances of the piezoelectric transducer 1 showing a vibration with a large amplitude, the piezoelectric transducer 1 is applied with an alternating voltage with sine wave of a frequency about 130 kHz. A cold cathode having a diameter of 3.0 millimeters and a length of 220 millimeters is loaded for burning test thereof thereby it was confirmed that input and output voltages, currents and powers are the same as those before the piezoelectric transducer 1 is supported. There was also confirmed the facts that a degree of brightness of the cold cathode and a heat temperature of the piezoelectric transducer 1 are the same as those before the piezoelectric transducer 1 is supported. A hundred of the piezoelectric vibrators were subjected to vibration and impact tests under an lacceleration of 100 G for subsequent remeasurments of the performances and properties thereof. That is, the piezoelectric vibrator subjected to the vibration and the impact is subjected again to the small vibration test using the impedance analyzer for the purpose of measuring the performance when the small vibration is shown as well as again to the burning test by having the cold cathode loaded for the purpose of measuring the properties of the piezoelectric transducer showing the large vibration. The performances of the piezoelectric transducer 1 showing either the small or large vibration are not changed.

The above measuring results would prove that the improved supporting structure of the piezoelectric vibrator for supporting the piezoelectric transducer 1 permits the piezoelectric transducer to exhibit the same performances as those shown by the piezoelectric transducer not supported. That is, the supporting structure for supporting the piezoelectric transducer 1 permits the piezoelectric vibrator to exhibit excellent vibration properties inherently possessed free of support. The supporting structure also permits the piezoelectric vibrator to have the same highly mechanical quality factor as that when the piezoelectric transducer is not supported. Notwithstanding, the supporting structure permits the piezoelectric vibrator to show an excellent impact-resistance thereby a highly reliability of the piezoelectric vibrator is kept under variety of conditions. The supporting supporting structure also permits the piezoelectric transducer to have a high electrodynamic coupling coefficient. The supporting structure also permits the piezoelectric transducer to be free from the issues both of heat generation and of vibration loss on the ground that since the piezoelectric transducer 1 is not fixed nor adhered to the case 7, an extremely small friction reduced by the projections 11 is caused between the piezoelectric transducer 1 and the case 7. The supporting structure is quite simple, for that reason a scale down of the vibrator is permitted and further a production of the vibrator with a reduced cost is also permitted. The supporting structure is free of the requirement of an alignment at a high accuracy when the piezoelectric transducer 1 is supported and accommodated in the case 7.

Whereas in the above embodiment the case 7 is made of polycarbonate, the case 7 may alternatively be made of a glass epoxy resin. The piezoelectric transducer 1 accommodated in the glass epoxy resin case was subjected to the foregoing measuring teats thereby it was confirmed that the supporting structure may permit the piezoelectric transducer 1 to exhibit the same excellent performances and properties as when the polycarbonate case 7 is used. Other available material for the case 7 may be a phenol resin, a polyester resin, melanin resin and an epoxy resin individuals of which provide the same effect as the polycarbonate resin.

Although the gap 9 between the top of the top projections 11 and the top of the top input electrodes 2 is set 0.3 millimeters, a gap in the range from 0.1 to 0.5 millimeters is available as providing the same effect as the 0.3 millimeters gap. The diameter of the through hole 10 may be not less than 2 millimeters to prevent the case 7 to hit with the solder for bonding the leads to the piezoelectric transducer 1.

Figure 6:
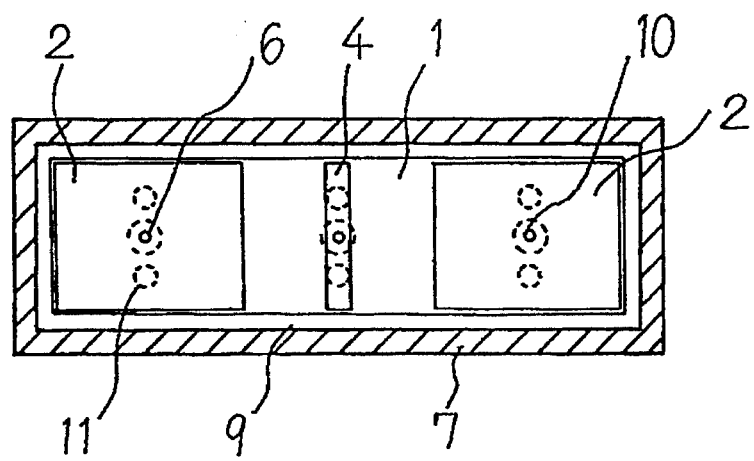
FIG. 6 is a cross sectional horizontal view illustrative of a novel supporting structure for supporting a piezoelectric vibrator in a third embodiment according to the present invention.

A third embodiment according to the present invention will be described in which a novel supporting structure for supporting a piezoelectric vibrator having a plate-like shape is provided. A piezoelectric vibrator of the third embodiment has a structural difference from that of the second embodiment in defined positions at which a plurality of projections 11 are provided. This is, the projections 11 are provided on the inner walls of the case in the vicinity of the vibration node of the piezoelectric transducer, namely in the vicinity of the through holes through which the leads penetrate. The detailed description will be made with reference to FIG. 6.

A piezoelectric vibrator in a third embodiment according to the present invention comprises a piezoelectric transducer 1 accommodated in a case 7 comprising a bottom plate 8 on which the piezoelectric transducer 1 is placed and a cover provided on the bottom plate 8. The piezoelectric transducer has a plate-like shape, for example, 37×6×1 millimeters-size. The piezoelectric transducer 1 is made of a piezoelectric porcelain. The piezoelectric transducer 1 is provided with top and bottom input and output electrodes 2 and 3 thereon. The top input electrodes 2 are provided on a top surface of the piezoelectric transducer 1 at opposite end regions thereof as well as the bottom electrodes 3 are provided on a top surface of the piezoelectric transducer 1 at opposite end regions thereof. The top and bottom output electrodes 4 and 5 are provided on the top and bottom surfaces of the piezoelectric transducer 1 at a center position thereof. Each of the top input electrodes 2 has a lead 6 extending upward from a center portion thereof and penetrating through a through hole 10 formed in the cover constituting, together with the bottom plate 8, the case 7. Each of the bottom input electrodes 3 has a lead 6 extending downward from a center portion thereof and penetrating through a through hole 10 formed in the bottom plate 8 constituting, together with the cover, the case 7. The top output electrode 4 has a lead 6 extending upward from a center portion thereof and penetrating through a through hole 10 formed in the cover constituting, together with the bottom plate 8, the case 7. The bottom output electrode 5 has a lead 6 extending downward from a center portion thereof and penetrating through a through hole 10 formed in the bottom plate 8 constituting, together with the cover, the case 7. The piezoelectric transducer 1 is designed to show a vibration with nodes being positioned corresponding to the positions at which the leads 6 are provided. Each of the leads is soldered at node point of each of the electrodes. The leads 6 comprise copper wires coated with tin and have a diameter of 0.1 millimeters so that the leads 6 have a sufficient flexibility for allowing the vibration of the piezoelectric transducer 1 and a capability for allowing a high power to be applied to the piezoelectric transducer 1. The above case 7 may be made of a polycarbonate resin.

The followings are important for the present invention. A plurality of projections 11 are formed on top and bottom inner walls of the case 7 so that the projections formed on the bottom inner wall or on the bottom plate 8 are made contact with the bottom input electrodes 3 thereby the piezoelectric transducer 1 is substantially supported by the projections 11. Each of the projections has a height of 0.1 millimeters and a diameter of 1 millimeter. The projections 11 are provided in the vicinity of the vibration nodes of the piezoelectric transducer 1 so that the function of the projections 11 as a supporting element is kept independent from the vibration of the piezoelectric transducer 1. This is understandable from the fact that the amplitude of the vibration of the piezoelectric transducer 1 becomes small as approaching the node of the piezoelectric transducer performing as a vibrator. As compared to the supporting structure of the second embodiment, the projections 11 of the third embodiment has an advantage in the independency from the vibration of the piezoelectric transducer 1 performing as a vibrator thereby the projections 11 may show high and stable supporting functions and may even reduce an area contacting with the bottom electrodes 3 thereby a friction between the piezoelectric transducer 1 and the case 7 is considerably reduced.

Each of the through holes 10 through which the leads 6 penetrate has a larger diameter or size than a diameter or a size of the leads 6 so that each of the leads 6 is spaced apart from an inner wall of each of the through holes 10 so that there is provided a clearance between the lead 6 and the inner wall of the through hole formed in the case 7 thereby the leads 6 are allowed to show a small displacement or a vibration. The case 7 is so designed that there are gaps in the horizontal and vertical directions between the piezoelectric transducer 1 and the inner wall of the case 7. That is, the case 7 is so designed as to have slightly larger height, wide and length than those of the piezoelectric transducer 1. The piezoelectric transducer 1 is merely put on the bottom plate 8 constituting the case 7, however, not fixed nor adhered to the bottom plate 8 or the case 7 so that the piezoelectric transducer 1 united with the leads 6 is permitted to show a vibration and a displacement defined in the horizontal direction by the clearance associated with the through holes or the clearance between the leads 6 and the inner wall of the through holes 10 and defined in a gap between a top of the top electrode on the piezoelectric transducer 1 and a top of the inner walls of the case 7. For example, the case 7 may be so designed that a gap 9 be 0.3 millimeters between a top of the top projections 11 and a top of the top output electrodes 2. The through holes 10 may be designed to have a diameter of 3 millimeters.

Performances and properties of the piezoelectric vibrator were measured by use of an impedance analyzer. The measured electrodynamic coupling coefficient Qm of the piezoelectric transducer 1 showing a vibration with a small amplitude was the same as that before the piezoelectric transducer was supported. To evaluate performances of the piezoelectric transducer 1 showing a vibration with a large amplitude, the piezoelectric transducer 1 is applied with an alternating voltage with sine wave of a frequency about 130 kHz. A cold cathode having a diameter of 3.0 millimeters and a length of 220 millimeters is loaded for burning test thereof thereby it was confirmed that input and output voltages, currents and powers are the same as those before the piezoelectric transducer 1 is supported. There was also confirmed the facts that a degree of brightness of the cold cathode and a heat temperature of the piezoelectric transducer 1 are the same as those before the piezoelectric transducer 1 is supported. A hundred of the piezoelectric vibrators were subjected to vibration and impact tests under an lacceleration of 100 G for subsequent remeasurments of the performances and properties thereof. That is, the piezoelectric vibrator subjected to the vibration and the impact is subjected again to the small vibration test using the impedance analyzer for the purpose of measuring the performance when the small vibration is shown as well as again to the burning test by having the cold cathode loaded for the purpose of measuring the properties of the piezoelectric transducer showing the large vibration. The performances of the piezoelectric transducer 1 showing either the small or large vibration are not changed.

The above measuring results would prove that the improved supporting structure of the piezoelectric vibrator for supporting the piezoelectric transducer 1 permits the piezoelectric transducer to exhibit the same performances as those shown by the piezoelectric transducer not supported. That is, the supporting structure for supporting the piezoelectric transducer 1 permits the piezoelectric vibrator to exhibit excellent vibration properties inherently possessed free of support. The supporting structure also permits the piezoelectric vibrator to have the same highly mechanical quality factor as that when the piezoelectric transducer is not supported. Notwithstanding, the supporting structure permits the piezoelectric vibrator to show an excellent impact-resistance thereby a highly reliability of the piezoelectric vibrator is kept under variety of conditions. The supporting supporting structure also permits the piezoelectric transducer to have a high electrodynamic coupling coefficient. The supporting structure also permits the piezoelectric transducer to be free from the issues both of heat generation and of vibration loss on the ground that since the piezoelectric transducer 1 is not fixed nor adhered to the case 7, an extremely small friction reduced by the projections 11 is caused between the piezoelectric transducer 1 and the case 7. The supporting structure is quite simple, for that reason a scale down of the vibrator is permitted and further a production of the vibrator with a reduced cost is also permitted. The supporting structure is free of the requirement of an alignment at a high accuracy when the piezoelectric transducer 1 is supported and accommodated in the case 7.

Whereas in the above embodiment the case 7 is made of polycarbonate, the case 7 may alternatively be made of a glass epoxy resin. The piezoelectric transducer 1 accommodated in the glass epoxy resin case was subjected to the foregoing measuring teats thereby it was confirmed that the supporting structure may permit the piezoelectric transducer 1 to exhibit the same excellent performances and properties as when the polycarbonate case 7 is used. Other available material for the case 7 may be a phenol resin, a polyester resin, melanin resin and an epoxy resin individuals of which provide the same effect as the polycarbonate resin.

Although the gap 9 between the top of the top projections 11 and the top of the top input electrodes 2 is set 0.3 millimeters, a gap in the range from 0.1 to 0.5 millimeters is available as providing the same effect as the 0.3 millimeters gap. The diameter of the through hole 10 may be not less than 2 millimeters to prevent the case 7 to hit with the solder for bonding the leads to the piezoelectric transducer 1.

Figure 7:
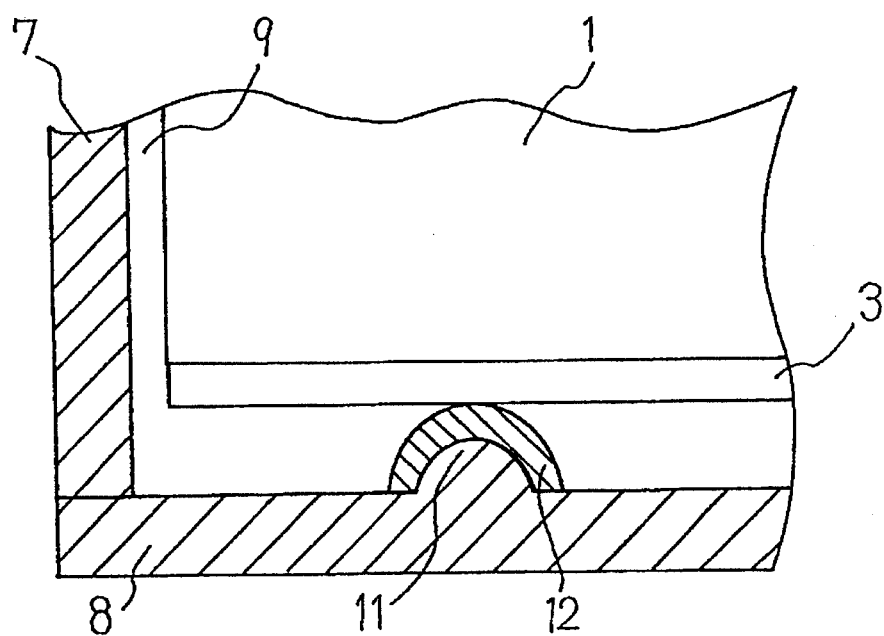
FIG. 7 is a fragmentary enlarged cross sectional elevation view illustrative of a novel supporting structure for supporting a piezoelectric vibrator in a fourth embodiment according to the present invention.

A fourth embodiment according to the present invention will be described in which a novel supporting structure for supporting a piezoelectric vibrator having a plate-like shape is provided. A piezoelectric vibrator of the fourth embodiment has a structural difference from that of the second embodiment in view of further providing coating layers 12 on on surfaces of a plurality of projections 11. The coating layers 12 have a small friction coefficient such as Teflon or Delrin to thereby allow the piezoelectric transducer 1 to show a friction free vibration and then to reduce a friction between the projections 11 and the piezoelectric transducer 1 showing the vibration. The detailed description will be made with reference to FIG. 7.

A piezoelectric vibrator in a fourth embodiment according to the present invention comprises a piezoelectric transducer 1 accommodated in a case 7 comprising a bottom plate 8 on which the piezoelectric transducer 1 is placed and a cover provided on the bottom plate 8. The piezoelectric transducer has a plate-like shape, for example, 37×6×1 millimeters-size. The piezoelectric transducer 1 is made of a piezoelectric porcelain. The piezoelectric transducer 1 is provided with top and bottom input and output electrodes 2 and 3 thereon. The top input electrodes 2 are provided on a top surface of the piezoelectric transducer 1 at opposite end regions thereof as well as the bottom electrodes 3 are provided on a top surface of the piezoelectric transducer 1 at opposite end regions thereof. The top and bottom output electrodes 4 and 5 are provided on the top and bottom surfaces of the piezoelectric transducer 1 at a center position thereof. Each of the top input electrodes 2 has a lead 6 extending upward from a center portion thereof and penetrating through a through hole 10 formed in the cover constituting, together with the bottom plate 8, the case 7. Each of the bottom input electrodes 3 has a lead 6 extending downward from a center portion thereof and penetrating through a through hole 10 formed in the bottom plate 8 constituting, together with the cover, the case 7. The top output electrode 4 has a lead 6 extending upward from a center portion thereof and penetrating through a through hole 10 formed in the cover constituting, together with the bottom plate 8, the case 7. The bottom output electrode 5 has a lead 6 extending downward from a center portion thereof and penetrating through a through hole 10 formed in the bottom plate 8 constituting, together with the cover, the case 7. The piezoelectric transducer 1 is designed to show a vibration with nodes being positioned corresponding to the positions at which the leads 6 are provided. Each of the leads is soldered at node point of each of the electrodes. The leads 6 comprise copper wires coated with tin and have a diameter of 0.1 millimeters so that the leads 6 have a sufficient flexibility for allowing the vibration of the piezoelectric transducer 1 and a capability for allowing a high power to be applied to the piezoelectric transducer 1. The above case 7 may be made of a polycarbonate resin.

The followings are important for the present invention. A plurality of projections 11 are formed on top and bottom inner walls of the case 7 and coating layers 12 are formed to coat the projections 11 wherein the coating layers 12 have a small friction coefficient for allowing the piezoelectric transducer 1 to show a friction free vibration namely to reduce a friction between the projection 11 and the piezoelectric transducer 1. Each of the projections 11 has a height of 0.1 millimeters and a diameter of 1 millimeter. As compared to the supporting structure of the second embodiment, the projections 11 coated with the coating layers 12 having a smaller friction coefficient in the fourth embodiment may further reduce a friction between the projections 11 and the piezoelectric transducer 1.

Each of the through holes 10 through which the leads 6 penetrate has a larger diameter or size than a diameter or a size of the leads 6 so that each of the leads 6 is spaced apart from an inner wall of each of the through holes 10 so that there is provided a clearance between the lead 6 and the inner wall of the through hole formed in the case 7 thereby the leads 6 are allowed to show a small displacement or a vibration. The case 7 is so designed that there are gaps in the horizontal and vertical directions between the piezoelectric transducer 1 and the inner wall of the case 7. That is, the case 7 is so designed as to have slightly larger height, wide and length than those of the piezoelectric transducer 1. The piezoelectric transducer 1 is merely put on the bottom plate 8 constituting the case 7, however, not fixed nor adhered to the bottom plate 8 or the case 7 so that the piezoelectric transducer 1 united with the leads 6 is permitted to show a vibration and a displacement defined in the horizontal direction by the clearance associated with the through holes or the clearance between the leads 6 and the inner wall of the through holes 10 and defined in a gap between a top of the top electrode on the piezoelectric transducer 1 and a top of the inner walls of the case 7. For example, the case 7 may be so designed that a gap 9 be 0.3 millimeters between a top of the top projections 11 and a top of the top output electrodes 2. The through holes 10 may be designed to have a diameter of 3 millimeters.

Performances and properties of the piezoelectric vibrator were measured by use of an impedance analyzer. The measured electrodynamic coupling coefficient Qm of the piezoelectric transducer 1 showing a vibration with a small amplitude was the same as that before the piezoelectric transducer was supported. To evaluate performances of the piezoelectric transducer 1 showing a vibration with a large amplitude, the piezoelectric transducer 1 is applied with an alternating voltage with sine wave of a frequency about 130 kHz. A cold cathode having a diameter of 3.0 millimeters and a length of 220 millimeters is loaded for burning test thereof thereby it was confirmed that input and output voltages, currents and powers are the same as those before the piezoelectric transducer 1 is supported. There was also confirmed the facts that a degree of brightness of the cold cathode and a heat temperature of the piezoelectric transducer 1 are the same as those before the piezoelectric transducer 1 is supported. A hundred of the piezoelectric vibrators were subjected to vibration and impact tests under an lacceleration of 100 G for subsequent remeasurments of the performances and properties thereof. That is, the piezoelectric vibrator subjected to the vibration and the impact is subjected again to the small vibration test using the impedance analyzer for the purpose of measuring the performance when the small vibration is shown as well as again to the burning test by having the cold cathode loaded for the purpose of measuring the properties of the piezoelectric transducer showing the large vibration. The performances of the piezoelectric transducer 1 showing either the small or large vibration are not changed.

The above measuring results would prove that the improved supporting structure of the piezoelectric vibrator for supporting the piezoelectric transducer 1 permits the piezoelectric transducer to exhibit the same performances as those shown by the piezoelectric transducer not supported. That is, the supporting structure for supporting the piezoelectric transducer 1 permits the piezoelectric vibrator to exhibit excellent vibration properties inherently possessed free of support. The supporting structure also permits the piezoelectric vibrator to have the same highly mechanical quality factor as that when the piezoelectric transducer is not supported. Notwithstanding, the supporting structure permits the piezoelectric vibrator to show an excellent impact-resistance thereby a highly reliability of the piezoelectric vibrator is kept under variety of conditions. The supporting supporting structure also permits the piezoelectric transducer to have a high electrodynamic coupling coefficient. The supporting structure also permits the piezoelectric transducer to be free from the issues both of heat generation and of vibration loss on the ground that since the piezoelectric transducer 1 is not fixed nor adhered to the case 7, an extremely small friction reduced by the projections 11 is caused between the piezoelectric transducer 1 and the case 7. The supporting structure is quite simple, for that reason a scale down of the vibrator is permitted and further a production of the vibrator with a reduced cost is also permitted. The supporting structure is free of the requirement of an alignment at a high accuracy when the piezoelectric transducer 1 is supported and accommodated in the case 7.

Whereas in the above embodiment the case 7 is made of polycarbonate, the case 7 may alternatively be made of a glass epoxy resin. The piezoelectric transducer 1 accommodated in the glass epoxy resin case was subjected to the foregoing measuring teats thereby it was confirmed that the supporting structure may permit the piezoelectric transducer 1 to exhibit the same excellent performances and properties as when the polycarbonate case 7 is used. Other available material for the case 7 may be a phenol resin, a polyester resin, melanin resin and an epoxy resin individuals of which provide the same effect as the polycarbonate resin.

Although the gap 9 between the top of the top projections 11 and the top of the top input electrodes 2 is set 0.3 millimeters, a gap in the range from 0.1 to 0.5 millimeters is available as providing the same effect as the 0.3 millimeters gap. The diameter of the through hole 10 may be not less than 2 millimeters to prevent the case 7 to hit with the solder for bonding the leads to the piezoelectric transducer 1.

Figure 8:
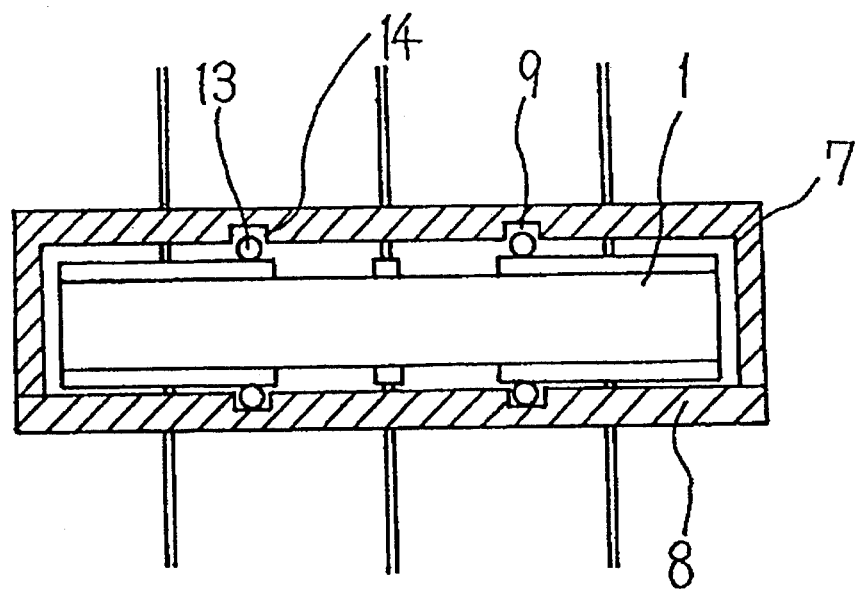
FIG. 8 is a cross sectional elevation view illustrative of a novel supporting structure for supporting a piezoelectric vibrator in a fifth embodiment according to the present invention.

A fifth embodiment according to the present invention will be described in which a novel supporting structure for supporting a piezoelectric vibrator having a plate-like shape is provided. A piezoelectric vibrator of the fifth embodiment has a structural difference from that of the first embodiment in view of further providing a plurality of balls 13 and corresponding recesses 14 formed on an inner surface of a case 7 for receiving the balls 13. The recesses 14 have a size larger than a size of the balls 13 to allow the balls to show a roll motion with an extremely small or almost no friction. The balls 13 are made contact with input electrode formed on a piezoelectric transducer. The detailed description will be made with reference to FIG. 8.

A piezoelectric vibrator in a fifth embodiment according to the present invention comprises a piezoelectric transducer 1 accommodated in a case 7 comprising a bottom plate 8 on which the piezoelectric transducer 1 is placed and a cover provided on the bottom plate 8. The piezoelectric transducer has a plate-like shape, for example, 37×6×1 millimeters-size. The piezoelectric transducer 1 is made of a piezoelectric porcelain. The piezoelectric transducer 1 is provided with top and bottom input and output electrodes 2 and 3 thereon. The top input electrodes 2 are provided on a top surface of the piezoelectric transducer 1 at opposite end regions thereof as well as the bottom electrodes 3 are provided on a top surface of the piezoelectric transducer 1 at opposite end regions thereof. The top and bottom output electrodes 4 and 5 are provided on the top and bottom surfaces of the piezoelectric transducer 1 at a center position thereof. Each of the top input electrodes 2 has a lead 6 extending upward from a center portion thereof and penetrating through a through hole 10 formed in the cover constituting, together with the bottom plate 8, the case 7. Each of the bottom input electrodes 3 has a lead 6 extending downward from a center portion thereof and penetrating through a through hole 10 formed in the bottom plate 8 constituting, together with the cover, the case 7. The top output electrode 4 has a lead 6 extending upward from a center portion thereof and penetrating through a through hole 10 formed in the cover constituting, together with the bottom plate 8, the case 7. The bottom output electrode 5 has a lead 6 extending downward from a center portion thereof and penetrating through a through hole 10 formed in the bottom plate 8 constituting, together with the cover, the case 7. The piezoelectric transducer 1 is designed to show a vibration with nodes being positioned corresponding to the positions at which the leads 6 are provided. Each of the leads is soldered at node point of each of the electrodes. The leads 6 comprise copper wires coated with tin and have a diameter of 0.1 millimeters so that the leads 6 have a sufficient flexibility for allowing the vibration of the piezoelectric transducer 1 and a capability for allowing a high power to be applied to the piezoelectric transducer 1. The above case 7 may be made of a polycarbonate resin.

The followings are important for the present invention. A plurality of recesses 14 are formed on top and bottom inner walls of the case 7. A plurality of balls 13 having a diameter of 1 millimeter are further provided in the individual recesses 14 so that the balls formed on the bottom inner wall or on the bottom plate 8 are made contact with the bottom input electrodes 3 thereby the piezoelectric transducer 1 is substantially supported by the balls 13. As compared to the supporting structure of the first embodiment, the balls 13 of the fifth embodiment may provide a considerable reduction of a friction between the piezoelectric transducer 1 and the case 7.

Each of the through holes 10 through which the leads 6 penetrate has a larger diameter or size than a diameter or a size of the leads 6 so that each of the leads 6 is spaced apart from an inner wall of each of the through holes 10 so that there is provided a clearance between the lead 6 and the inner wall of the through hole formed in the case 7 thereby the leads 6 are allowed to show a small displacement or a vibration. The case 7 is so designed that there are gaps in the horizontal and vertical directions between the piezoelectric transducer 1 and the inner wall of the case 7. That is, the case 7 is so designed as to have slightly larger height, wide and length than those of the piezoelectric transducer 1. The piezoelectric transducer 1 is merely put on the bottom plate 8 constituting the case 7, however, not fixed nor adhered to the bottom plate 8 or the case 7 so that the piezoelectric transducer 1 united with the leads 6 is permitted to show a vibration and a displacement defined in the horizontal direction by the clearance associated with the through holes or the clearance between the leads 6 and the inner wall of the through holes 10 and defined in a gap between a top of the top electrode on the piezoelectric transducer 1 and a top of the inner walls of the case 7. For example, the case 7 may be so designed that a gap 9 be 0.3 millimeters between a top of the top projections 11 and a top of the top output electrodes 2. The through holes 10 may be designed to have a diameter of 3 millimeters.

Performances and properties of the piezoelectric vibrator were measured by use of an impedance analyzer. The measured electrodynamic coupling coefficient Qm of the piezoelectric transducer 1 showing a vibration with a small amplitude was the same as that before the piezoelectric transducer was supported. To evaluate performances of the piezoelectric transducer 1 showing a vibration with a large amplitude, the piezoelectric transducer 1 is applied with an alternating voltage with sine wave of a frequency about 130 kHz. A cold cathode having a diameter of 3.0 millimeters and a length of 220 millimeters is loaded for burning test thereof thereby it was confirmed that input and output voltages, currents and powers are the same as those before the piezoelectric transducer 1 is supported. There was also confirmed the facts that a degree of brightness of the cold cathode and a heat temperature of the piezoelectric transducer 1 are the same as those before the piezoelectric transducer 1 is supported. A hundred of the piezoelectric vibrators were subjected to vibration and impact tests under an lacceleration of 100 G for subsequent remeasurments of the performances and properties thereof. That is, the piezoelectric vibrator subjected to the vibration and the impact is subjected again to the small vibration test using the impedance analyzer for the purpose of measuring the performance when the small vibration is shown as well as again to the burning test by having the cold cathode loaded for the purpose of measuring the properties of the piezoelectric transducer showing the large vibration. The performances of the piezoelectric transducer 1 showing either the small or large vibration are not changed.

The above measuring results would prove that the improved supporting structure of the piezoelectric vibrator for supporting the piezoelectric transducer 1 permits the piezoelectric transducer to exhibit the same performances as those shown by the piezoelectric transducer not supported. That is, the supporting structure for supporting the piezoelectric transducer 1 permits the piezoelectric vibrator to exhibit excellent vibration properties inherently possessed free of support. The supporting structure also permits the piezoelectric vibrator to have the same highly mechanical quality factor as that when the piezoelectric transducer is not supported. Notwithstanding, the supporting structure permits the piezoelectric vibrator to show an excellent impact-resistance thereby a highly reliability of the piezoelectric vibrator is kept under variety of conditions. The supporting supporting structure also permits the piezoelectric transducer to have a high electrodynamic coupling coefficient. The supporting structure also permits the piezoelectric transducer to be free from the issues both of heat generation and of vibration loss on the ground that since the piezoelectric transducer 1 is not fixed nor adhered to the case 7, an extremely small friction reduced by the projections 11 is caused between the piezoelectric transducer 1 and the case 7. The supporting structure is quite simple, for that reason a scale down of the vibrator is permitted and further a production of the vibrator with a reduced cost is also permitted. The supporting structure is free of the requirement of an alignment at a high accuracy when the piezoelectric transducer 1 is supported and accommodated in the case 7.

Whereas in the above embodiment the case 7 is made of polycarbonate, the case 7 may alternatively be made of a glass epoxy resin. The piezoelectric transducer 1 accommodated in the glass epoxy resin case was subjected to the foregoing measuring teats thereby it was confirmed that the supporting structure may permit the piezoelectric transducer 1 to exhibit the same excellent performances and properties as when the polycarbonate case 7 is used. Other available material for the case 7 may be a phenol resin, a polyester resin, melanin resin and an epoxy resin individuals of which provide the same effect as the polycarbonate resin.

Although the gap 9 between the top of the top projections 11 and the top of the top input electrodes 2 is set 0.3 millimeters, a gap in the range from 0.1 to 0.5 millimeters is available as providing the same effect as the 0.3 millimeters gap. The diameter of the through hole 10 may be not less than 2 millimeters to prevent the case 7 to hit with the solder for bonding the leads to the piezoelectric transducer 1.

Figure 9:
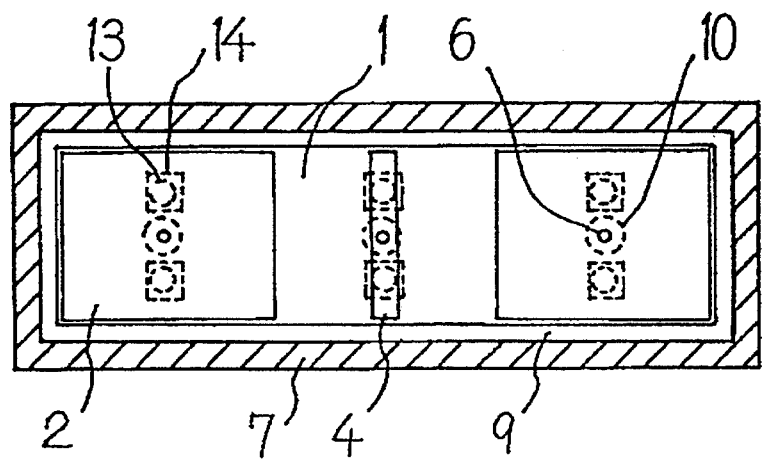
FIG. 9 is a cross sectional elevation view illustrative of a novel supporting structure for supporting a piezoelectric vibrator in a sixth embodiment according to the present invention.

A sixth embodiment according to the present invention will be described in which a novel supporting structure for supporting a piezoelectric vibrator having a plate-like shape is provided. A piezoelectric vibrator of the sixth embodiment has a structural difference from that of the fifth embodiment in view of further providing a plurality of balls 13 and corresponding recesses 14 formed on an inner surface of a case 7 for receiving the balls 13. The recesses 14 have a size larger than a size of the balls 13 to allow the balls to show a roll motion with an extremely small or almost no friction. The balls 13 are made contact with input electrode formed on a piezoelectric transducer. The balls 13 received in the recesses 14 are positioned as near as possible to the nodes of the piezoelectric transducer therein the leads are provided at the nodes thereof. The detailed description will be made with reference to FIG. 9.

A piezoelectric vibrator in a sixth embodiment according to the present invention comprises a piezoelectric transducer 1 accommodated in a case 7 comprising a bottom plate 8 on which the piezoelectric transducer 1 is placed and a cover provided on the bottom plate 8. The piezoelectric transducer has a plate-like shape, for example, 37×6×1 millimeters-size. The piezoelectric transducer 1 is made of a piezoelectric porcelain. The piezoelectric transducer 1 is provided with top and bottom input and output electrodes 2 and 3 thereon. The top input electrodes 2 are provided on a top surface of the piezoelectric transducer 1 at opposite end regions thereof as well as the bottom electrodes 3 are provided on a top surface of the piezoelectric transducer 1 at opposite end regions thereof. The top and bottom output electrodes 4 and 5 are provided on the top and bottom surfaces of the piezoelectric transducer 1 at a center position thereof. Each of the top input electrodes 2 has a lead 6 extending upward from a center portion thereof and penetrating through a through hole 10 formed in the cover constituting, together with the bottom plate 8, the case 7. Each of the bottom input electrodes 3 has a lead 6 extending downward from a center portion thereof and penetrating through a through hole 10 formed in the bottom plate 8 constituting, together with the cover, the case 7. The top output electrode 4 has a lead 6 extending upward from a center portion thereof and penetrating through a through hole 10 formed in the cover constituting, together with the bottom plate 8, the case 7. The bottom output electrode 5 has a lead 6 extending downward from a center portion thereof and penetrating through a through hole 10 formed in the bottom plate 8 constituting, together with the cover, the case 7. The piezoelectric transducer 1 is designed to show a vibration with nodes being positioned corresponding to the positions at which the leads 6 are provided. Each of the leads 6 is soldered at node point of each of the electrodes. The leads 6 comprise copper wires coated with tin and have a diameter of 0.1 millimeters so that the leads 6 have a sufficient flexibility for allowing the vibration of the piezoelectric transducer 1 and a capability for allowing a high power to be applied to the piezoelectric transducer 1. The above case 7 may be made of a polycarbonate resin.

The followings are important for the present invention. A plurality of recesses 14 are formed on top and bottom inner walls of the case 7 in the vicinity of nodes of the piezoelectric transducer 1 wherein the leads 6 are provided at the nodes. A plurality of balls 13 having a diameter of 1 millimeter are further provided in the individual recesses 14 so that the balls 13 formed on the bottom inner wall or on the bottom plate 8 are made contact, at its positions neat to the nodes, with the bottom input electrodes 3 thereby the piezoelectric transducer 1 is substantially supported by the balls 13. As compared to the supporting structure of the fifth embodiment, the balls 13 of the sixth embodiment may be free from any affection of the vibration of the piezoelectric transducer 1. An amplitude of the vibration shown by piezoelectric transducer 1 becomes small as approaching the nodes of the piezoelectric transducer 1. The balls 13 received in the recesses 14 formed in the vicinity of the nodes of the piezoelectric transducer 1 may receive a small amplitude vibration of the piezoelectric transducer 1. This may ensure that the balls 13 may show stable and excellent supporting functions.

Each of the through holes 10 through which the leads 6 penetrate has a larger diameter or size than a diameter or a size of the leads 6 so that each of the leads 6 is spaced apart from an inner wall of each of the through holes 10 so that there is provided a clearance between the lead 6 and the inner wall of the through hole formed in the case 7 thereby the leads 6 are allowed to show a small displacement or a vibration. The case 7 is so designed that there are gaps in the horizontal and vertical directions between the piezoelectric transducer 1 and the inner wall of the case 7. That is, the case 7 is so designed as to have slightly larger height, wide and length than those of the piezoelectric transducer 1. The piezoelectric transducer 1 is merely put on the bottom plate 8 constituting the case 7, however, not fixed nor adhered to the bottom plate 8 or the case 7 so that the piezoelectric transducer 1 united with the leads 6 is permitted to show a vibration and a displacement defined in the horizontal direction by the clearance associated with the through holes or the clearance between the leads 6 and the inner wall of the through holes 10 and defined in a gap between a top of the top electrode on the piezoelectric transducer 1 and a top of the inner walls of the case 7. For example, the case 7 may be so designed that a gap 9 be 0.3 millimeters between a top of the top projections 11 and a top of the top output electrodes 2. The through holes 10 may be designed to have a diameter of 3 millimeters.

Performances and properties of the piezoelectric vibrator were measured by use of an impedance analyzer. The measured electrodynamic coupling coefficient Qm of the piezoelectric transducer 1 showing a vibration with a small amplitude was the same as that before the piezoelectric transducer was supported. To evaluate performances of the piezoelectric transducer 1 showing a vibration with a large amplitude, the piezoelectric transducer 1 is applied with an alternating voltage with sine wave of a frequency about 130 kHz. A cold cathode having a diameter of 3.0 millimeters and a length of 220 millimeters is loaded for burning test thereof thereby it was confirmed that input and output voltages, currents and powers are the same as those before the piezoelectric transducer 1 is supported. There was also confirmed the facts that a degree of brightness of the cold cathode and a heat temperature of the piezoelectric transducer 1 are the same as those before the piezoelectric transducer 1 is supported. A hundred of the piezoelectric vibrators were subjected to vibration and impact tests under an lacceleration of 100 G for subsequent remeasurments of the performances and properties thereof. That is, the piezoelectric vibrator subjected to the vibration and the impact is subjected again to the small vibration test using the impedance analyzer for the purpose of measuring the performance when the small vibration is shown as well as again to the burning test by having the cold cathode loaded for the purpose of measuring the properties of the piezoelectric transducer showing the large vibration. The performances of the piezoelectric transducer 1 showing either the small or large vibration are not changed.

The above measuring results would prove that the improved supporting structure of the piezoelectric vibrator for supporting the piezoelectric transducer 1 permits the piezoelectric transducer to exhibit the same performances as those shown by the piezoelectric transducer not supported.

That is, the supporting structure for supporting the piezoelectric transducer 1 permits the piezoelectric vibrator to exhibit excellent vibration properties inherently possessed free of support. The supporting structure also permits the piezoelectric vibrator to have the same highly mechanical quality factor as that when the piezoelectric transducer is not supported. Notwithstanding, the supporting structure permits the piezoelectric vibrator to show an excellent impact-resistance thereby a highly reliability of the piezoelectric vibrator is kept under variety of conditions. The supporting supporting structure also permits the piezoelectric transducer to have a high electrodynamic coupling coefficient. The supporting structure also permits the piezoelectric transducer to be free from the issues both of heat generation and of vibration loss on the ground that since the piezoelectric transducer 1 is not fixed nor adhered to the case 7, an extremely small friction reduced by the projections 11 is caused between the piezoelectric transducer 1 and the case 7. The supporting structure is quite simple, for that reason a scale down of the vibrator is permitted and further a production of the vibrator with a reduced cost is also permitted. The supporting structure is free of the requirement of an alignment at a high accuracy when the piezoelectric transducer 1 is supported and accommodated in the case 7.

Whereas in the above embodiment the case 7 is made of polycarbonate, the case 7 may alternatively be made of a glass epoxy resin. The piezoelectric transducer 1 accommodated in the glass epoxy resin case was subjected to the foregoing measuring teats thereby it was confirmed that the supporting structure may permit the piezoelectric transducer 1 to exhibit the same excellent performances and properties as when the polycarbonate case 7 is used. Other available material for the case 7 may be a phenol resin, a polyester resin, melanin resin and an epoxy resin individuals of which provide the same effect as the polycarbonate resin.

Although the gap 9 between the top of the top projections 11 and the top of the top input electrodes 2 is set 0.3 millimeters, a gap in the range from 0.1 to 0.5 millimeters is available as providing the same effect as the 0.3 millimeters gap. The diameter of the through hole 10 may be not less than 2 millimeters to prevent the case 7 to hit with the solder for bonding the leads to the piezoelectric transducer 1.

Figure 10:
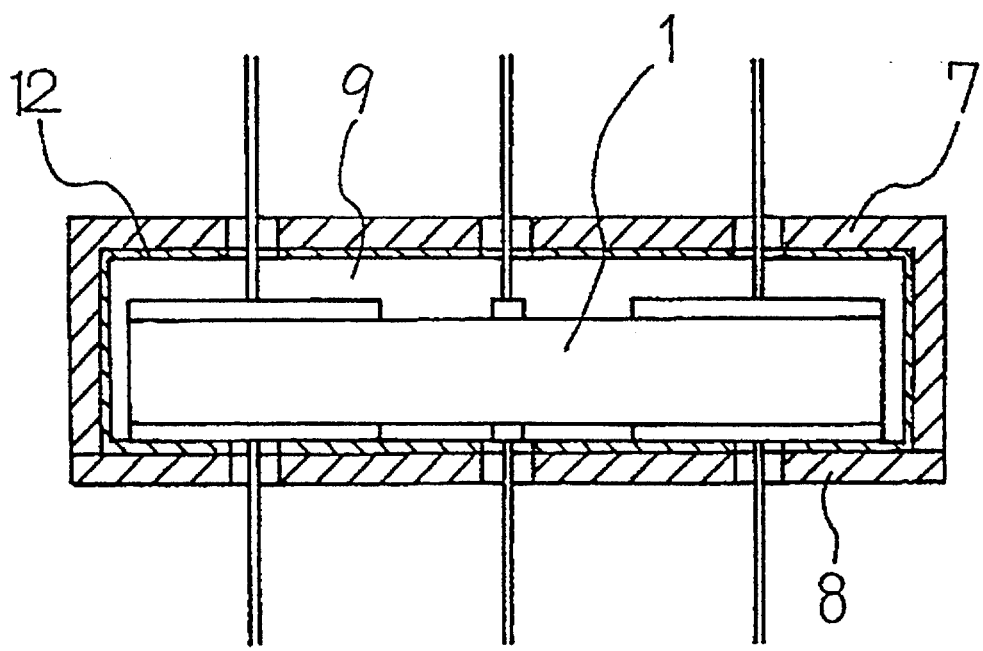
FIG. 10 is a cross sectional elevation view illustrative of a novel supporting structure for supporting a piezoelectric vibrator in a seventh embodiment according to the present invention.

A seventh embodiment according to the present invention will be described in which a novel supporting structure for supporting a piezoelectric vibrator having a plate-like shape is provided. A piezoelectric vibrator of the seventh embodiment has a structural difference from that of the first embodiment in view of further providing a coating film on an entire of an inner surface of a case accommodating a piezoelectric transducer. The detailed description will be made with reference to FIG. 10.

A piezoelectric vibrator in a seventh embodiment according to the present invention comprises a piezoelectric transducer 1 accommodated in a case 7 comprising a bottom plate 8 on which the piezoelectric transducer 1 is placed and a cover provided on the bottom plate 8. The piezoelectric transducer has a plate-like shape, for example, 37×6×1 millimeters-size. The piezoelectric transducer 1 is made of a piezoelectric porcelain. The piezoelectric transducer 1 is provided with top and bottom input and output electrodes 2 and 3 thereon. The top input electrodes 2 are provided on a top surface of the piezoelectric transducer 1 at opposite end regions thereof as well as the bottom electrodes 3 are provided on a top surface of the piezoelectric transducer 1 at opposite end regions thereof. The top and bottom output electrodes 4 and 5 are provided on the top and bottom surfaces of the piezoelectric transducer 1 at a center position thereof. Each of the top input electrodes 2 has a lead 6 extending upward from a center portion thereof and penetrating through a through hole 10 formed in the cover constituting, together with the bottom plate 8, the case 7. Each of the bottom input electrodes 3 has a lead 6 extending downward from a center portion thereof and penetrating through a through hole 10 formed in the bottom plate 8 constituting, together with the cover, the case 7. The top output electrode 4 has a lead 6 extending upward from a center portion thereof and penetrating through a through hole 10 formed in the cover constituting, together with the bottom plate 8, the case 7. The bottom output electrode 5 has a lead 6 extending downward from a center portion thereof and penetrating through a through hole 10 formed in the bottom plate 8 constituting, together with the cover, the case 7. The piezoelectric transducer 1 is designed to show a vibration with nodes being positioned corresponding to the positions at which the leads 6 are provided. Each of the leads is soldered at node point of each of the electrodes. The leads 6 comprise copper wires coated with tin and have a diameter of 0.1 millimeters so that the leads 6 have a sufficient flexibility for allowing the vibration of the piezoelectric transducer 1 and a capability for allowing a high power to be applied to the piezoelectric transducer 1. The above case 7 may be made of a polycarbonate resin.

The followings are important for the present invention. A coating film 12 having a smaller friction coefficient is formed on an entire of an inter surface of the case 7 so that the coating film 12 is made contact with the bottom input electrodes 3 to thereby reduce a friction between he case 7 and the piezoelectric transducer 1. The coating film 12 may be made of materials having a smaller friction coefficient such as Teflon. As compared to the supporting structure of the first embodiment, the coating film 12 of the seventh embodiment may reduce a friction between the case 7 and the piezoelectric transducer 1.

Each of the through holes 10 through which the leads 6 penetrate has a larger diameter or size than a diameter or a size of the leads 6 so that each of the leads 6 is spaced apart from an inner wall of each of the through holes 10 so that there is provided a clearance between the lead 6 and the inner wall of the through hole formed in the case 7 thereby the leads 6 are allowed to show a small displacement or a vibration. The case 7 is so designed that there are gaps in the horizontal and vertical directions between the piezoelectric transducer 1 and the inner wall of the case 7. That is, the case 7 is so designed as to have slightly larger height, wide and length than those of the piezoelectric transducer 1. The piezoelectric transducer 1 is merely put on the bottom plate 8 constituting the case 7, however, not fixed nor adhered to the bottom plate 8 or the case 7 so that the piezoelectric transducer 1 united with the leads 6 is permitted to show a vibration and a displacement defined in the horizontal direction by the clearance associated with the through holes or the clearance between the leads 6 and the inner wall of the through holes 10 and defined in a gap between a top of the top electrode on the piezoelectric transducer 1 and a top of the inner walls of the case 7. For example, the case 7 may be so designed that a gap 9 be 0.3 millimeters between the coating film 12 and a top of the top output electrodes 2. The through holes 10 may be designed to have a diameter of 3 millimeters.

Performances and properties of the piezoelectric vibrator were measured by use of an impedance analyzer. The measured electrodynamic coupling coefficient Qm of the piezoelectric transducer 1 showing a vibration with a small amplitude was the same as that before the piezoelectric transducer was supported. To evaluate performances of the piezoelectric transducer 1 showing a vibration with a large amplitude, the piezoelectric transducer 1 is applied with an alternating voltage with sine wave of a frequency about 130 kHz. A cold cathode having a diameter of 3.0 millimeters and a length of 220 millimeters is loaded for burning test thereof thereby it was confirmed that input and output voltages, currents and powers are the same as those before the piezoelectric transducer 1 is supported. There was also confirmed the facts that a degree of brightness of the cold cathode and a heat temperature of the piezoelectric transducer 1 are the same as those before the piezoelectric transducer 1 is supported. A hundred of the piezoelectric vibrators were subjected to vibration and impact tests under an lacceleration of 100 G for subsequent remeasurments of the performances and properties thereof. That is, the piezoelectric vibrator subjected to the vibration and the impact is subjected again to the small vibration test using the impedance analyzer for the purpose of measuring the performance when the small vibration is shown as well as again to the burning test by having the cold cathode loaded for the purpose of measuring the properties of the piezoelectric transducer showing the large vibration. The performances of the piezoelectric transducer 1 showing either the small or large vibration are not changed.

The above measuring results would prove that the improved supporting structure of the piezoelectric vibrator for supporting the piezoelectric transducer 1 permits the piezoelectric transducer to exhibit the same performances as those shown by the piezoelectric transducer not supported. That is, the supporting structure for supporting the piezoelectric transducer 1 permits the piezoelectric vibrator to exhibit excellent vibration properties inherently possessed free of support. The supporting structure also permits the piezoelectric vibrator to have the same highly mechanical quality factor as that when the piezoelectric transducer is not supported. Notwithstanding, the supporting structure permits the piezoelectric vibrator to show an excellent impact-resistance thereby a highly reliability of the piezoelectric vibrator is kept under variety of conditions. The supporting supporting structure also permits the piezoelectric transducer to have a high electrodynamic coupling coefficient. The supporting structure also permits the piezoelectric transducer to be free from the issues both of heat generation and of vibration loss on the ground that since the piezoelectric transducer 1 is not fixed nor adhered to the case 7, an extremely small friction reduced by the coating film 12 is caused between the piezoelectric transducer 1 and the case 7. The supporting structure is quite simple, for that reason a scale down of the vibrator is permitted and further a production of the vibrator with a reduced cost is also permitted. The supporting structure is free of the requirement of an alignment at a high accuracy when the piezoelectric transducer 1 is supported and accommodated in the case 7.

Whereas in the above embodiment the case 7 is made of polycarbonate, the case 7 may alternatively be made of a glass epoxy resin. The piezoelectric transducer 1 accommodated in the glass epoxy resin case was subjected to the foregoing measuring teats thereby it was confirmed that the supporting structure may permit the piezoelectric transducer 1 to exhibit the same excellent performances and properties as when the polycarbonate case 7 is used. Other available material for the case 7 may be a phenol resin, a polyester resin, melanin resin and an epoxy resin individuals of which provide the same effect as the polycarbonate resin.

Although the gap 9 between the coating film 12 and the top of the top input electrodes 2 is set 0.3 millimeters, a gap in the range from 0.1 to 0.5 millimeters is available as providing the same effect as the 0.3 millimeters gap. The diameter of the through hole 10 may be not less than 2 millimeters to prevent the case 7 to hit with the solder for bonding the leads to the piezoelectric transducer 1.

Although in the foregoing first to seventh embodiments, the piezoelectric transducer 1 is accommodated in the case 1 enclosing the same entirely, the present invention may no doubt be applicable when the case lack of a top roof.

While in the foregoing first to seventh embodiments the bottom leads 6 extending downward through the through holes to the exterior from the bottom input and output electrodes formed on the bottom surface of the piezoelectric transducer 1, the present invention may no doubt be applicable when the bottom leads are provided on the bottom input and output electrodes to extend along the inner wall of the case and projecting from the top roof of the case through the top through holes formed on the top roof of the case.

Whereas still other modifications of the present invention will be apparent to a person having ordinary skill in the art, to which the invention pertains, it is to be understood that embodiments shown and described by way of illustrations are by no means intended to be considered in a limiting sense. Accordingly, it is to be intended to cover by claims all modifications which fall within the spirit and scope of the present invention.

What is claimed is:

1. A piezoelectric vibrator comprising:

a piezoelectric element showing a vibration by receiving an alternating voltage, said piezoelectric element having a rectangular shape and being provided with at least one input electrode from which an input lead extends and at least one output electrode from which an output lead extends; and a case having a rectangle shape for accommodating said piezoelectric element, said case having at least through holes through which said input and output leads penetrate thereby said leads project to an exterior of said case:

wherein said through holes have a size larger than a size of said leads to create a clearance between said leads and inner walls of said through holes so as to allow said leads to show a displacement or a vibration due to the vibration of said piezoelectric element; and wherein said case has a size larger than a size of said piezoelectric element for forming gaps between said piezoelectric element and said case to allow said piezoelectric element to be freely vibrate, said piezoelectric element being merely placed on a bottom of said case but not fixed nor adhered thereon to allow said piezoelectric element to be freely vibrated.

2. The piezoelectric vibrator as claimed in claim 1, wherein said leads are provided at positions corresponding to nodes in said vibrations of said piezoelectric element to keep said leads in showing almost no vibration.

3. The piezoelectric vibrator as claimed in claim 2, further comprising a plurality of projections being formed at least on an inner surface of said bottom of said case so that said piezoelectric element is supported through said projections.

4. The piezoelectric vibrator as claimed in claim 3, further comprising a plurality of coating layers which coat individuals of said projections, said coating layers having a smaller friction coefficient than a friction coefficient of said projections.

5. The piezoelectric vibrator as claimed in claim 4, wherein said coating layers are made of synthetic resin polymer.

6. The piezoelectric vibrator as claimed in claim 4, wherein said coating layers are made of homopolymer acetal resin.

7. The piezoelectric vibrator as claimed in claim 3, wherein said a plurality of projections are provided in the vicinity of said nodes of said piezoelectric element.

8. The piezoelectric vibrator as claimed in claim 2, further comprising:

a plurality of recesses formed at least on an inner surface of said bottom of said case; and a plurality of balls received in said recesses so that said piezoelectric element is supported through said balls.

9. The piezoelectric vibrator as claimed in claim 8, wherein said a plurality of recesses receiving said balls are provided in the vicinity of said nodes of said piezoelectric element.

10. The piezoelectric vibrator as claimed in claim 1, further comprising a coating film formed at least on an inner surface of said bottom of said case so that said piezoelectric element is supported through said coating film on said bottom of said case, said coating film having a smaller friction coefficient than a friction coefficient of said case.

11. The piezoelectric vibrator as claimed in claim 10, wherein said coating film is made of synthetic resin polymer.

12. The piezoelectric vibrator as claimed in claim 10, wherein said coating film is made of homopolymer acetal resin.

13. A piezoelectric vibrator comprising:

a piezoelectric transducer showing a vibration by receiving an alternating voltage, said piezoelectric transducer having a plate shape and being provided with at least four input electrodes on top and bottom surfaces thereof and at opposite terminal portions thereof, said piezoelectric transducer being also provided with at least two output electrodes on said top and bottom surface thereof and at a center position thereof, each of said input electrodes being fixed with a lead extending upward or downward therefrom, each of said output electrodes being also fixed with a lead extending upward or downward therefrom, said leads being provided at positions corresponding to nodes in said vibrations of said piezoelectric transducer; and a case having a rectangle shape for accommodating said piezoelectric transducer, said case having at least through holes through which said input and output leads penetrate thereby said leads project to an exterior of said case:

wherein said through holes have a size larger than a size of said leads to create a clearance between said leads and inner walls of said through holes so as to allow said leads to show a displacement or a vibration due to the vibration of said piezoelectric transducer; and wherein said case has a size larger than a size of said piezoelectric transducer for forming gaps between said piezoelectric transducer and said case to allow said piezoelectric transducer to be freely vibrate, said piezoelectric transducer being merely placed on a bottom of said case but not fixed nor adhered thereon to allow said piezoelectric transducer to be freely vibrated.

14. The piezoelectric vibrator as claimed in claim 13, wherein said case is made of a material selected from the group consisting of a polycarbonate resin, a glass epoxy resin, a phenol resin, a polyester resin, a melamine resin and an epoxy resin.

15. The piezoelectric vibrator as claimed in claim 13, further comprising a plurality of projections being formed at least on an inner surface of said bottom of said case so that said piezoelectric transducer is supported through said projections.

16. The piezoelectric vibrator as claimed in claim 15, further comprising a plurality of coating layers which coat individuals of said projections, said coating layers having a smaller friction coefficient than a friction coefficient of said projections.

17. The piezoelectric vibrator as claimed in claim 16, wherein said coating layers are made of synthetic resin polymer.

18. The piezoelectric vibrator as claimed in claim 16, wherein said coating layers are made of homopolymer acetal resin.

19. The piezoelectric vibrator as claimed in claim 15, wherein said a plurality of projections are provided in the vicinity of said nodes of said piezoelectric transducer.

20. The piezoelectric vibrator as claimed in claim 13, further comprising:

a plurality of recesses formed at least on an inner surface of said bottom of said case; and a plurality of balls received in said recesses so that said piezoelectric transducer is supported through said balls.

21. The piezoelectric vibrator as claimed in claim 20, wherein said a plurality of recesses receiving said balls are provided in the vicinity of said nodes of said piezoelectric transducer.

22. The piezoelectric vibrator as claimed in claim 13, further comprising a coating film formed at least on an inner surface of said bottom of said case so that said piezoelectric transducer is supported through said coating film on said bottom of said case, said coating film having a smaller friction coefficient than a friction coefficient of said case.

23. The piezoelectric vibrator as claimed in claim 22, wherein said coating film is made of synthetic resin polymer.

24. The piezoelectric vibrator as claimed in claim 22, wherein said coating film is made of homopolymer acetal resin.

* * * * *